(12) United States Patent
Pedersen et al.

(10) Patent No.: US 8,572,841 B2
(45) Date of Patent: Nov. 5, 2013

(54) PRINTED WIRING BOARD ASSEMBLY AND RELATED METHODS

(75) Inventors: Anders P. Pedersen, Palm Bay, FL (US); Daniel A. Robison, Palm Bay, FL (US); Alan W. Mast, Melbourne Beach, FL (US)

(73) Assignee: Harris Corporation, Melbourne, FL (US)

( * ) Notice: Subject to any disclaimer, the term of this patent is extended or adjusted under 35 U.S.C. 154(b) by 1116 days.

(21) Appl. No.: 12/051,133

(22) Filed: Mar. 19, 2008

(65) Prior Publication Data

US 2009/0236139 A1 Sep. 24, 2009

(51) Int. Cl.
*H05K 3/30* (2006.01)

(52) U.S. Cl.
USPC .......... 29/834; 29/832; 29/846; 174/260

(58) Field of Classification Search
USPC .......... 29/832–834, 840, 846, 847, 854; 174/260; 257/690, 777, 723; 361/748; 438/67, 118, 109
See application file for complete search history.

(56) References Cited

U.S. PATENT DOCUMENTS

| | | | | |
|---|---|---|---|---|
| 4,794,092 A | * | 12/1988 | Solomon | 438/109 |
| 5,067,233 A | * | 11/1991 | Solomon | 29/833 |
| 5,266,833 A | * | 11/1993 | Capps | 257/690 |
| 5,300,911 A | | 4/1994 | Walters | 336/175 |
| 5,661,901 A | * | 9/1997 | King | 29/830 |
| 5,892,287 A | * | 4/1999 | Hoffman et al. | 257/777 |
| 6,075,287 A | * | 6/2000 | Ingraham et al. | 257/723 |
| 6,128,817 A | | 10/2000 | Roessler et al. | 29/606 |
| 6,345,989 B1 | | 2/2002 | Mason et al. | 439/74 |
| 6,472,744 B1 | | 10/2002 | Sato et al. | 257/723 |
| 6,548,766 B2 | | 4/2003 | Daido | 174/261 |
| 6,721,187 B2 | | 4/2004 | Hall et al. | 361/760 |
| 6,739,880 B2 | | 5/2004 | Toyota | 439/74 |
| 7,009,570 B2 | | 3/2006 | Durham et al. | 343/753 |
| 7,161,457 B2 | | 1/2007 | Meadors et al. | 336/200 |
| 7,304,862 B2 | | 12/2007 | Busletta et al. | 361/760 |
| 2004/0233024 A1 | | 11/2004 | Almeida et al. | 333/246 |
| 2006/0042831 A1 | | 3/2006 | Rohde et al. | 174/262 |
| 2007/0107935 A1 | | 5/2007 | Hash et al. | 174/265 |
| 2008/0036673 A1 | | 2/2008 | Yamagajo et al. | 343/793 |

* cited by examiner

*Primary Examiner* — Donghai D. Nguyen
(74) *Attorney, Agent, or Firm* — Allen, Dyer, Doppelt, Milbrath & Gilchrist, P.A.

(57) ABSTRACT

A method is for making a printed wiring board (PWB) assembly. The method may include forming a first PWB having a plurality of first electrically conductive pads, forming a second PWB including a plurality of electrically conductive traces having exposed ends on an edge surface of the second PWB, and covering the edge surface of the second PWB with an electrically conductive layer. The method may also include selectively removing portions of the electrically conductive layer to define a plurality of second electrically conductive pads electrically connected to corresponding ones of the exposed ends of the electrically conductive traces, and assembling the first and second PWBs together so that the first and second electrically conductive pads are electrically coupled together to define the PWB assembly.

14 Claims, 4 Drawing Sheets

PRINTED WIRING BOARD ASSEMBLY AND RELATED METHODS

FIELD OF THE INVENTION

The present invention relates to the field of circuit boards, and, more particularly, to assembled printed wiring boards and related methods.

BACKGROUND OF THE INVENTION

An electronic device may include one or more circuit boards. A typical circuit board is a planar board that mechanically supports electronic components. The electronic components may comprise, for example, resistors, capacitors, switches, batteries, and other more complex integrated circuit components, i.e. microprocessors. The circuit board typically comprises a dielectric material, for example, a plastic material.

A simple circuit board may include conductive traces on its surface for connecting the electronic components to each other. As electronic circuitry has become more complex, multi-layer circuit boards with at least two electrically conductive trace layers sandwiched between dielectric layers have been developed. Typically, the different conductive trace layers of a multi-layer circuit board may be connected through vertically extending vias, which comprise conductive materials, for example, metal.

In certain applications, it may be desirable to interconnect two circuit boards arranged at a 90 degrees angle, each having electrically conductive pads on the major surfaces thereof. In other words, the edge surface of a first circuit board is mounted onto the major surface of the second circuit board. Moreover, this interconnection is typically accomplished using an interconnector component on the major surface of the second circuit board. Typically, the interconnector component physically couples the first and second circuit boards together and electrically couples the electrically conductive pads. The use of the interconnector component may increase the size of the assembled circuit boards. This may pose installation drawbacks in applications where space may be limited.

One approach to the above drawback is to interconnect circuit boards without using a separate interconnector component. For example, U.S. Pat. No. 6,345,989 to Mason et al. discloses a circuit board interconnector. The circuit board of Mason et al. includes conductive traces that extend outwardly beyond the edge surface of the circuit board, and contact pads provided thereon with a gap between the contact pads and the edge surface.

Another approach is disclosed in U.S. Patent Application Publication No. 2007/0107935 to Hash et al., also assigned to the assignee of the present application, Harris Corporation of Melbourne, Fla., the entire contents of which are incorporated by reference herein. Hash et al. discloses a method for fabricating contact pads within the edge surface of the first circuit board. The edge surface contact pads are coupled with the contact pads of the second circuit board. The method comprises drilling vias into each individual layer of the multi-layer circuit board, filling each via with an electrically conductive material (providing cylinders within the layer), and milling the layer to bisect the cylinders. One drawback of the Hash et al. method is the expense per unit for manufacturing may be high. Moreover, the vias for each of the layers need to be accurately aligned, adding a possible drawback to robust fabrication.

SUMMARY OF THE INVENTION

In view of the foregoing background, it is therefore an object of the present invention to provide a method for making a printed wiring board (PWB) assembly that is cost effective and efficiently manufactured.

This and other objects, features, and advantages in accordance with the present invention are provided by a method that may include forming a first PWB having a plurality of first electrically conductive pads, forming a second PWB including a plurality of electrically conductive traces having exposed ends on an edge surface of the second PWB, and covering the edge surface of the second PWB with an electrically conductive layer. The method may also include selectively removing portions of the electrically conductive layer to define a plurality of second electrically conductive pads electrically connected to corresponding ones of the exposed ends of the electrically conductive traces, and assembling the first and second PWBs together so that the first and second electrically conductive pads are electrically coupled together to define the PWB assembly. Advantageously, the PWB assembly may use less packaging and may be more efficiently manufactured.

In some embodiments, selectively removing portions of the electrically conductive layer may comprise selective laser removal. In other embodiments, selectively removing portions of the electrically conductive layer may comprise selective chemical removal. In yet other embodiments, selectively removing portions of the electrically conductive layer may comprise selective mechanical removal. Moreover, the edge surface of the second PWB may have a planar shape, and at least the second PWB may comprise a multi-layer PWB.

Furthermore, forming the first PWB may comprise forming the first PWB to have the plurality of first electrically conductive pads on a major surface thereof and so that the assembled first and second PWBs are inclined relative to one another. Forming the second PWB may also comprise forming the exposed ends of the electrically conductive traces so that each has an enlarged width and a same thickness relative to adjacent portions of the corresponding electrically conductive trace.

More specifically, the first and second electrically conductive pads may be arranged in a pattern to define a series of parallel strips. Alternatively or additionally, the first and second electrically conductive pads may be arranged in a pattern to define at least one coaxial connection. Additionally, the first electrically conductive pads may have different sizes, and adjacent ones of the second electrically conductive pads may have corresponding sizes, in other words, matching sizes.

Another aspect is directed to a PWB assembly that may include a first PWB comprising a plurality of first electrically conductive pads, and a second PWB comprising a plurality of electrically conductive traces having exposed ends on an edge surface of the second PWB. The exposed ends may each have an enlarged width and a same thickness relative to adjacent portions of the corresponding electrically conductive trace. The second PWB may also include a plurality of second electrically conductive pads on the edge surface and electrically connected to corresponding ones of the exposed ends. The first and second PWBs may be assembled together so that the first and second electrically conductive pads are electrically coupled together to define the PWB assembly.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and multiple prime notation is used to indicate similar elements in alternative embodiments.

Figure 1:
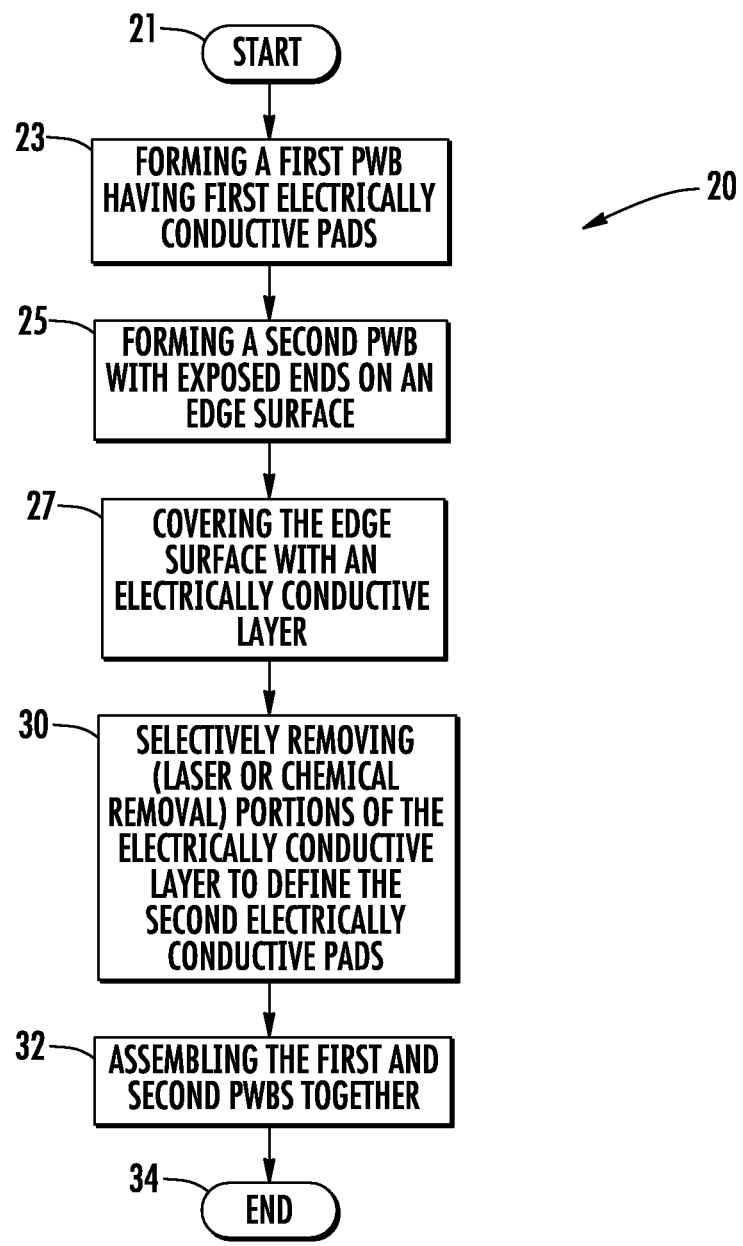
FIG. 1 is a flowchart illustrating a method for making a PWB assembly according to the present invention.
Figure 2:
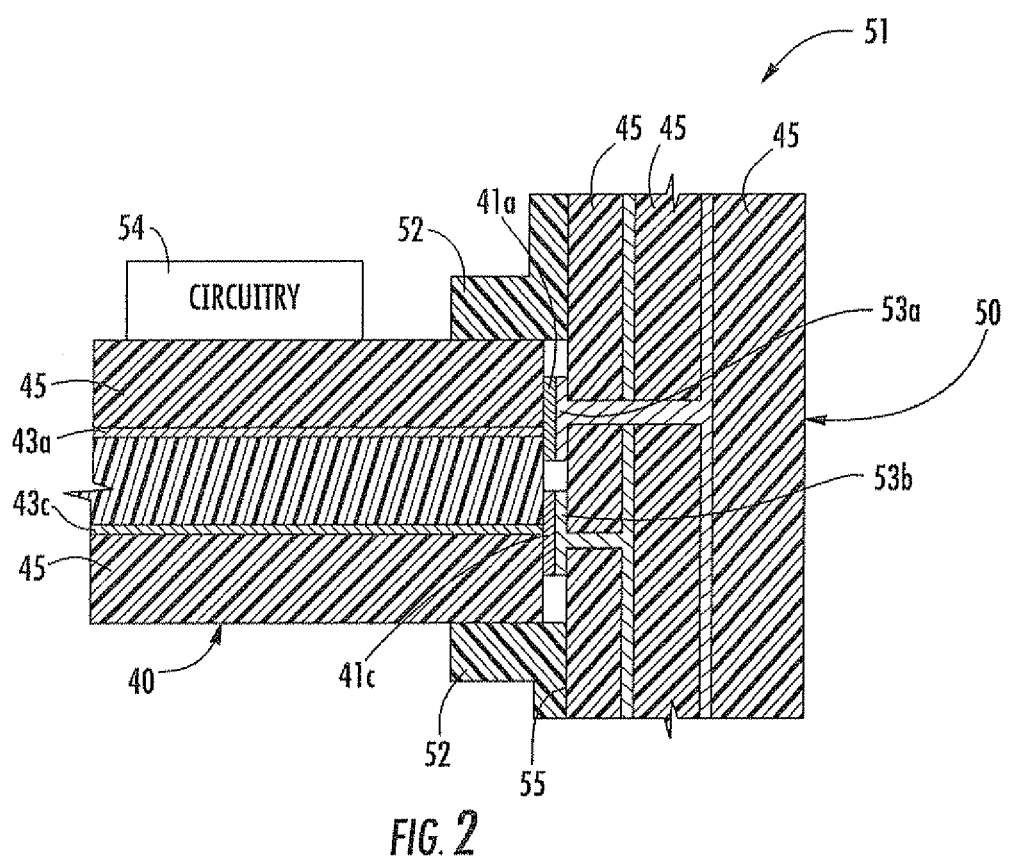
FIG. 2 is a schematic cross-sectional view of a PWB assembly made according to the method of FIG. 1.
Figure 3:
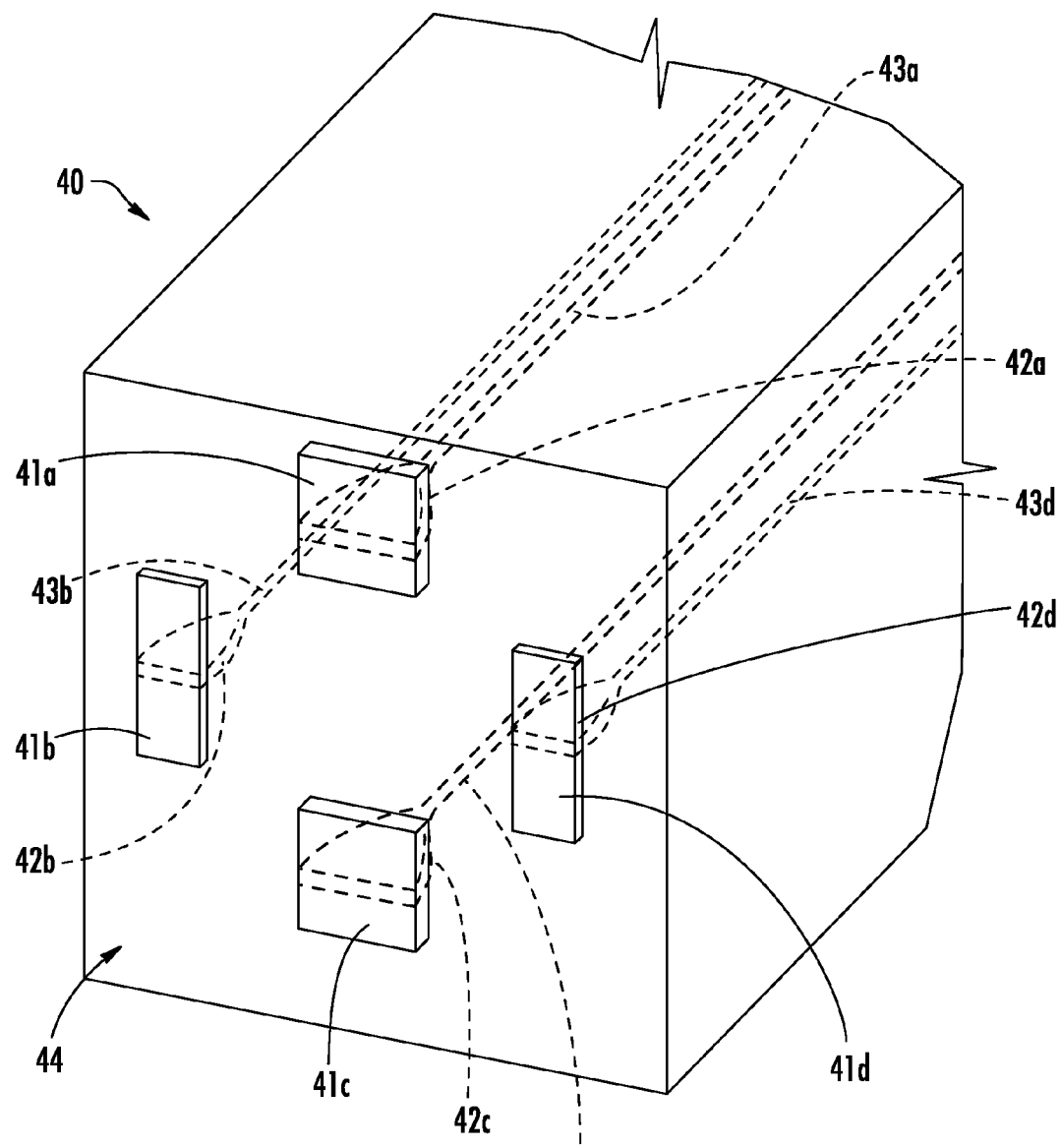
FIG. 3 is a schematic perspective end view of the second PWB shown in FIG. 2 according to the present invention.

Referring initially to FIGS. 1-3, a flowchart 20 illustrates a method for making a printed wiring board (PWB) assembly 51 that begins at Block 21. The method illustratively includes at Block 23 forming a first PWB 50 having a plurality of first electrically conductive pads 53a-53d. The first electrically conductive pads 53a-53d (only two of which are visible in FIG. 2, for clarity of explanation) are illustratively formed on a major surface 55 of the first PWB 50.

At Block 25, the method also illustratively includes forming a second PWB 40 including a plurality of electrically conductive traces 43a-43d (only two of which are visible in FIG. 2, for clarity of explanation) having exposed ends 42a-42d on an edge surface 44 of the second PWB. The exposed ends 42a-42d illustratively have an enlarged width and a same thickness relative to adjacent portions of the corresponding electrically conductive trace 43a-43d. The enlarged width of the exposed ends 42a-42d provides advantage over the milled cylinder ends of the prior art, for example, as in U.S. Patent Application Publication No. 2007/0107935 to Hash et al.

The edge surface 44 of the second PWB 40 is illustratively planar in shape. The first PWB 50 and the second PWB 40 each illustratively comprise a multi-layer circuit board including a plurality of dielectric layers 45 and conductive trace layers 43a-43d therebetween. Alternatively, the first PWB 50 may comprise a single/simple layer circuit board. In other words, at least the second PWB 40 comprises a multi-layer PWB. Moreover, circuitry 54 is mounted on the second PWB 40 and the first PWB 50.

The method also illustratively includes at Block 27 covering the edge surface 44 of the second PWB 40 with an electrically conductive layer, for example, a copper layer. The covering of the edge surface 44 may comprise, for example, plating, or deposition. The method illustratively includes at Block 30 selectively removing portions of the electrically conductive layer to define a plurality of second electrically conductive pads 41a-41d electrically connected to corresponding ones of the exposed ends 42a-42d of the electrically conductive trace 43a-43d. Additionally, the first electrically conductive pads 53a-53d may have different sizes, and adjacent ones of the second electrically conductive pads 41a-41d may have corresponding sizes.

The selective removal of the electrically conductive layer may comprise, for example, selective laser removal (laser ablation), selective chemical removal (chemical etching), or selective mechanical removal (milling). The laser ablation may be provided by a laser milling device, for example, as manufactured by the Micron Laser Corporation of Hillsboro, Oreg. As will be appreciated by those skilled in the art, other methods of selective removal may be used. Advantageously, the laser ablation removal of the electrically conductive layer may be cost effective and readily available. Moreover, since the removal step is performed on the complete second PWB 40, there are no alignment issues between second electrically conductive pads 41a-41d.

Moreover, laser ablation is accurate, for example, providing laser cutting geometries down to 0.002 inches. Laser ablation is also flexible in the shaping of the electrically conductive layer, for example, providing compatibility with a plurality of baseline interconnect technologies.

The method also illustratively includes at Block 32 assembling the first 50 and second 40 PWBs together so that the first 53a-53d and second 41a-41d electrically conductive pads are electrically coupled together to define the PWB assembly 51. Since the first electrically conductive pads 53a-53d are on the major surface 55 of the first PWB 50 and the second electrically conductive pads 41a-41d are formed on the edge surface 44 of the second PWB 40, the first and second PWBs, when assembled, are illustratively inclined at an angle to each other, for example, 90 degrees. Alternatively, the first 50 and second 40 PWBs may be assembled edge-to-edge, i.e. the first PWB would also include electrically conductive pads on its edge surface. The method ends at Block 34.

Figure 4:
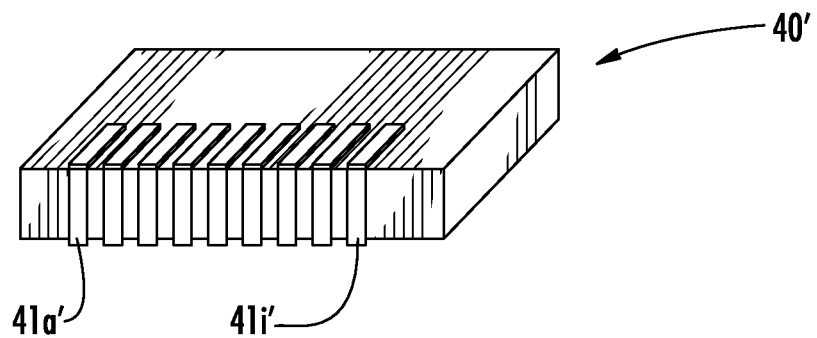
FIG. 4 is a schematic perspective view of another embodiment of the second PWB of the PWB assembly according to the present invention.

Referring now to FIG. 4, another embodiment of the second PWB 40' is now described. In this embodiment of the second PWB 40', those elements already discussed above with respect to FIGS. 2-3 are given prime notation and most require no further discussion herein. This embodiment differs from the previous embodiment in that the second PWB 40' includes the second electrically conductive pads 41a'-41i' being arranged in a pattern to define a series of parallel strips that wrap around the top and bottom of the edge surface 44'. The series of parallel strips are at a 0.5 mm pitch.

Figure 5:
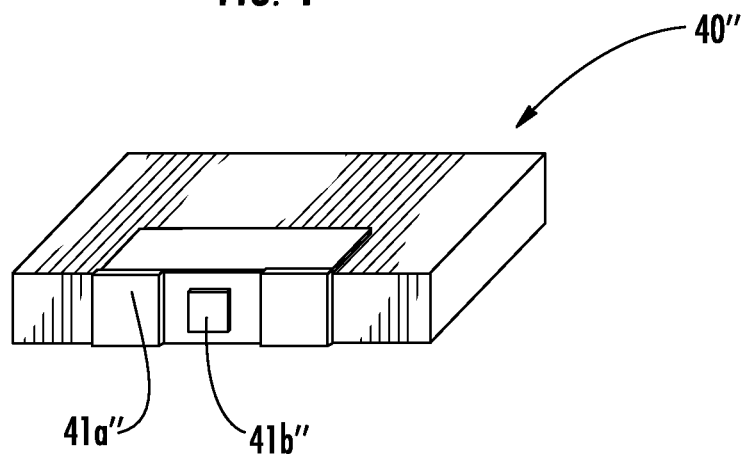
FIG. 5 is a schematic perspective view of yet another embodiment of the second PWB of the PWB assembly according to the present invention.

Referring now to FIG. 5, another embodiment of the second PWB 40" is now described. In this embodiment of the second PWB 40", those elements already discussed above with respect to FIGS. 2-3 are given double prime notation and most require no further discussion herein. This embodiment differs from the previous embodiment in that the second PWB 40" includes the second electrically conductive pads 41a"-41b" being arranged to define a coaxial connection, for example, a coaxial launch.

Figure 6:
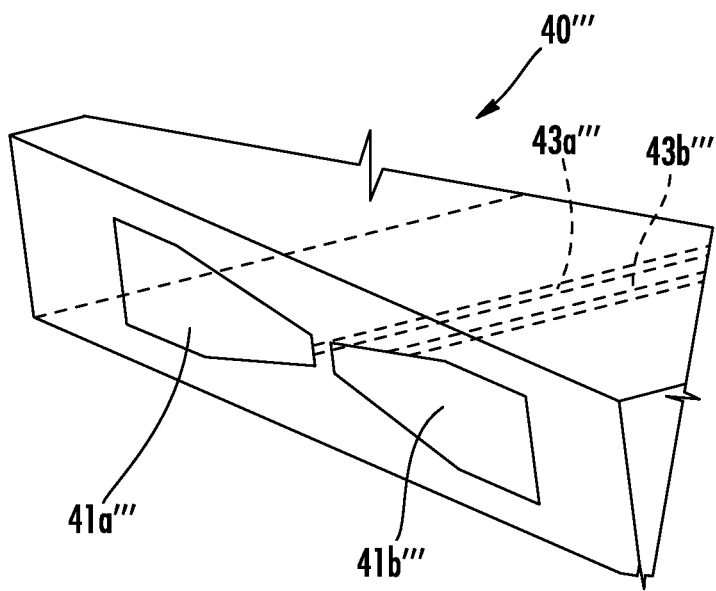
FIG. 6 is a schematic perspective view of still another embodiment of the second PWB of the PWB assembly according to the present invention.

Referring now to FIG. 6, another embodiment of the second PWB 40''' is now described. In this embodiment of the second PWB 40''', those elements already discussed above with respect to FIGS. 2-3 are given triple prime notation and most require no further discussion herein. This embodiment differs from the previous embodiment in that the second PWB 40''' includes the second electrically conductive pads 41a'''-41b''' being arranged to define an antenna for the circuitry carried by the second PWB.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making a printed wiring board (PWB) assembly comprising:
   forming a first PWB comprising a plurality of first electrically conductive pads;
   forming a second PWB comprising a plurality of internal electrically conductive traces having exposed ends on an edge surface of the second PWB, each internal electrically conductive trace having a width increasing as each internal electrically conductive trace approaches the edge surface;
   covering the edge surface of the second PWB with an electrically conductive layer;
   selectively removing portions of the electrically conductive layer to define a plurality of second electrically conductive pads electrically connected and having equivalent widths to corresponding ones of the exposed ends of the internal electrically conductive traces; and
   assembling the first and second PWBs together so that the first and second electrically conductive pads are electrically coupled together to define the PWB assembly.

2. The method according to claim 1 wherein selectively removing portions of the electrically conductive layer comprises selective laser removal.

3. The method according to claim 1 wherein selectively removing portions of the electrically conductive layer comprises selective chemical removal.

4. The method according to claim 1 wherein selectively removing portions of the electrically conductive layer comprises selective mechanical removal.

5. The method according to claim 1 wherein the edge surface of the second PWB has a planar shape.

6. The method according to claim 1 wherein at least the second PWB comprises a multi-layer PWB.

7. The method according to claim 1 wherein forming the first PWB comprises forming the first PWB to have the plurality of first electrically conductive pads on a major surface thereof and so that the assembled first and second PWBs are inclined relative to one another.

8. The method according to claim 1 wherein forming the second PWB comprises forming the exposed ends of the internal electrically conductive traces so that each has a same thickness relative to adjacent portions of the corresponding electrically conductive trace.

9. The method according to claim 1 wherein the first and second electrically conductive pads are arranged in a pattern to define a series of parallel strips.

10. The method according to claim 1 wherein the first and second electrically conductive pads are arranged in a pattern to define at least one coaxial connection.

11. The method according to claim 1 wherein the first electrically conductive pads have different sizes; and wherein adjacent ones of the second electrically conductive pads have corresponding sizes.

12. A method for making a printed wiring board (PWB) assembly comprising:
   forming a first PWB comprising a plurality of first electrically conductive pads;
   forming a second multi-layer PWB comprising a plurality of internal electrically conductive traces having exposed ends on a planar edge surface of the second multi-layer PWB, each internal electrically conductive trace having a width increasing as each internal electrically conductive trace approaches the planar edge surface;
   covering the planar edge surface of the second multi-layer PWB with an electrically conductive layer;
   selectively removing portions of the electrically conductive layer using a laser to define a plurality of second electrically conductive pads electrically connected and having equivalent widths to corresponding ones of the exposed ends of the internal electrically conductive traces; and
   assembling the first PWB and the second multi-layer PWB together so that the first and second electrically conductive pads are electrically coupled together to define the PWB assembly.

13. The method according to claim 12 wherein forming the first PWB comprises forming the first PWB to have the plurality of first electrically conductive pads on a major surface thereof and so that the assembled first PWB and the second multi-layer PWB are inclined relative to one another.

14. The method according to claim 12 wherein forming the second multi-layer PWB comprises forming the exposed ends of the internal electrically conductive traces so that each has a same thickness relative to adjacent portions of the corresponding electrically conductive trace.

* * * * *